(12) United States Patent
Chang

(10) Patent No.: US 6,260,087 B1
(45) Date of Patent: Jul. 10, 2001

(54) EMBEDDED CONFIGURABLE LOGIC ASIC

(76) Inventor: Web Chang, 3704 Monte Sereno Ter., Fremont, CA (US) 94539

( * ) Notice: Subject to any disclaimer, the term of this patent is extended or adjusted under 35 U.S.C. 154(b) by 0 days.

(21) Appl. No.: 09/261,244

(22) Filed: Mar. 3, 1999

(51) Int. Cl.[7] .................................................. G06F 13/00
(52) U.S. Cl. .................... 710/100; 710/104; 710/131; 712/32; 712/36; 326/39
(58) Field of Search .................... 710/126, 129, 710/131, 100, 104; 712/1, 32, 36, 41; 714/30, 33; 326/39, 40, 41; 345/503, 519

(56) References Cited

U.S. PATENT DOCUMENTS 5,687,325 * 11/1997 Chang .

5,841,790 * 11/1998 Salem et al. ...................... 714/724

* cited by examiner

Primary Examiner—Ario Etienne
(74) Attorney, Agent, or Firm—D. E. Schreiber, Esq.

(57) ABSTRACT

An Application Specific Integrated Circuit ("ASIC") (10, 30 and 40), which includes at least one hardware, non-programmable functional block (12, 14, 16, 18, 22, 32, 44, 46 and 48), also includes a programmable logic block ("PLB") (26). The PLB (26) is electrically programmable for performing at least one function that complements a function performed using the hardware, non-programmable functional block (12, 14, 16, 18, 22, 32, 44, 46 and 48). The presence of the PLB (26) in the ASIC providing system builders with an opportunity to readily differentiate products within their respective product lines by adding particular functions to the ASIC, and to also functionally differentiate among various products offered by competing system builders.

31 Claims, 2 Drawing Sheets

EMBEDDED CONFIGURABLE LOGIC ASIC

BACKGROUND OF THE INVENTION

1. Field of the Invention

The present invention relates generally to designing integrated circuits ("ICs") and, more particularly, to the design of Application Specific Integrated Circuits ("ASICs").

2. Description of the Prior Art

ASICs are used extensively throughout digital computers and other types of electronic circuits. For example, ASIC System Logic Controller ("SLC") ICs perform various functions essential to a digital computer's operation including, in many instances, interfacing between a high-speed CPU bus and a slower speed Input/output ("I/O") bus. Similarly, an ASIC super I/O IC, which is coupled to a digital computer's slower speed I/O bus, provides one or more serial ports, one or more parallel ports, a floppy diskette drive controller, and an interface for an Integrated Drive Electronics ("IDE") hard disk drive. Via a Small Computer System Interface ("SCSI") bus, ASICs also interface between a digital computer system's bus and a peripheral device, such as a disk drive, a printer, a scanner, a tape drive, a CD ROM drive or an optical storage drive. Computer display controller cards; Video on Demand set-top boxes; communication network systems such as 10BaseT, 100BaseT and Gigabit Ethernet hubs, switches and routers; industrial embedded controllers such as those used in automobiles, process monitoring and control, portable and cellular telephones, games and household appliances; as well as special purpose systems used to access the Internet all use ASICs.

Because ASICs provide a truly cost-effective way of implementing a large number of digital logic circuits to perform a particular function, ASIC designers and IC fabricators have developed certain techniques for reducing the difficulty, expense and time required to design and debug an ASIC, and to manufacture the ASIC in quantity. One technique to facilitate implementing ASICs is known as a Gate Array. Using a Gate Array, an ASIC designer merely specifies interconnections among individual digital logic circuits arranged in a pre-specified two-dimensional array of logic gates. Alternatively, a designer may specify an ASIC by selecting Standard Cells from among a library of cells provided by an IC fabricator, specifying the location for Standard Cells on an IC chip, and specifying interconnections among the selected Standard Cells.

Because experience has established that ASICs are cost-effective, the number of circuits included in and the complexity of ASIC designs increases year by year. Obviously, increasing ASIC complexity increases the likelihood of design errors in engineering prototypes, and also increases the number of iterations required to obtain a design that is commercially practical.

Moreover, not only are ASIC designs becoming ever more complex, ASIC fabrication techniques are also advancing year by year. In the foreseeable future, ASIC geometry will decreases from 0.35 micron feature size to 0.25 micron, 0.18 micron or even smaller feature size, while the size of IC wafers used for ASIC fabrication will concurrently increase in diameter from 6 inches to 8 inches, and to 12 inches. More complex ASIC designs will also require increasing the number of metalization layers from the 2 or 3 layers used at present to 5 or more layers of metalization. Fabricating each layer of metalization requires a different IC mask. The compounding effects of using ever smaller feature size on ever larger diameter IC wafers with an increasing number of metalization layers will significantly increase the Non-Recurring Expense ("NRE") of ASIC design, debugging and development.

For example, in the future the price of masks used in ASIC fabrication will increase from $2,000 per mask at present for 0.8 micron feature size geometry on a 6 inch diameter wafer to $10,000 per mask for 0.35 micron feature size geometry on an 8 inch diameter wafer. Consequently, because an average of seventeen (17) to thirty (30) masks will, in general, be required to fabricate future ASICs, NRE for each engineering prototype run will increase from $50,000 to $90,000 at present to perhaps $250,000 in the foreseeable future. An anticipated increase in wafer diameter from 8 inches to 12 inches will further increase the NRE for fabricating engineering prototypes.

Compounding all of the preceding technological considerations, that will surely increase the NRE of ASIC engineering, is the business reality that product life cycles continue to decrease. Traditional 4 to 8 week turn-arounds for fabricating an ASIC engineering prototype combined with 12 to 14 week lead times for ASIC production are becoming too long for product life cycles. Ever decreasing product life cycles in comparison with an ASIC's production cycle makes ASIC inventory control more difficult. For example, a particular ASIC design may become obsolete before exhausting a conventional three month inventory of the ASIC product.

There exist alternative ICs which digital logic designers may, in some instances, substitute for an ASIC. These alternatives, some of which are known as Field Programmable Gate Arrays ("FPGAs"), Programmable Array Logic ("PALs"),or Gate Array Logic ("GALs"), permit a digital logic designer to electronically program an IC to perform an application specific digital logic function. Moreover, some of these devices are electronically re-programmable, which, obviously, dramatically shortens the time for, and expense of fabricating and debugging a prototype ASIC. Consequently, electronically creating an ASIC by merely programming a standard IC appears highly desirable in comparison with physically manufacturing an ASIC. Unfortunately, in many instances presently available programmable logic devices such as FPGAs, PALs and GALs prove excessively expensive, particularly for high-volume products. Moreover, such ICs cannot, in general, provide a circuit density and/or circuit performance comparable to those readily obtainable using ASICs, i.e. levels of circuit density and/or performance that are necessary to produce a state-of-the-art product.

To address the preceding difficulties in ASIC prototype fabrication, Laser Programmable Gate Arrays ("LPGA") have been developed which permits prototyping an ASIC in one day. However, LPGAs are suitable only for low volume ASIC production, while mass production requires conventional ASIC fabrication. Moreover, because a LPGA is a Gate Array, it cannot provide the circuit density of a conventional ASIC, nor can it achieve an ASIC's electrical performance. Moreover, laser ASIC prototyping appears to require complicated, expensive, high-precision prototyping equipment that must be located in a centralized facility to which designs are transmitted for prototype fabrication. Finally, it appears that it will be difficult for laser prototyping to effectively and fully exploit the small feature size that foreseeable ASICs will employ, or large number of devices which such ICs will provide. Thus, while ASIC prototype fabrication using LPGAs, in some instances, offers an improvement over conventional ASIC prototype fabrication, the NRE still remains costly in comparison with directly re-programmable FPGAS, PALs or GALS, and implementing an ASIC using a LPGA remains less convenient and more opaque to IC designers than directly programmable devices.

To obviate the preceding difficulties in ASIC design U.S. Pat. No. 5,687,325 discloses an application specific field programmable gate array ("ASFPGA") that includes at least two fixed functional units in a single IC chip. Depending upon a specific application for the ASFPGA, the fixed functional units may include one or more bus interfaces, event timers, an interrupt controller, a Direct Memory Access ("DMA") controller, system timers, a realtime clock, a Random Access Memory ("RAM"), a clock synthesizer, a RAM Digital-to-Analog Converter ("DAC"), a display interface, a register file, a compressed image encoder/decoder ("CODEC"), a micro-controller, or similar functional units. The ASFPGA also includes a general purpose field programmable gate array ("FPGA"). The FPGA is configurable to effect a specific digital logic circuit interconnection between fixed functional units. After the FPGA has been configured, the fixed functional units together with the FPGA perform all the functions specified for a particular ASIC design.

An alternative way of obviating the preceding difficulties, designers of ASICs have begun including pre-designed functional blocks in the ASICS. Presently functional blocks are available for ASIC design which include a Dynamic Random Access Memory ("DRAM") block, a Static Random Access Memory ("SRAM") block, an Electronically Erasable Programmable Read Only Memory ("EEPROM") block, a FLASH Memory block, a First-In/First-Out ("FIFO") block, a Reduced Instruction Set Computer ("RISC") microprocessor block, a Digital Signal Processor ("DSP") block, bus interface blocks such as an Industry Standard Architecture ("ISA") bus interface block, an Extended Industry Standard Architecture ("EISA") bus interface block, a Video Electronics Standards Association ("VESA") bus interface block, a Peripheral Component Interconnect ("PCI") bus interface block, a Universal Serial Bus (USB"), an Up/Down Frequency Converter block, a Frequency-Hopping Spread-Spectrum Modulator/Demodulator block, a Baseband Analog-to-Digital Converter ("ADC") and DAC block, a Serial Data I/O ("SIO") block, etc.

In developing an ASIC using functional blocks, designers seek to obtain data specifying a particular functional block in at least four (4) different ways. First, a functional block to be employed in a new ASIC design may be extracted from or re-used from a previous ASIC design. If a prior ASIC design lacks a particular functional block, the designer may sometimes obtain data specifying a needed functional block from the foundry which will fabricate the ASIC. If previously developed functional blocks or functional blocks available from a foundry are inadequate for a particular ASIC design, the designer may seek to license a functional block's design data from some third party who has already developed and tested it. Lastly, if data specifying a suitable functional block design cannot be obtained in any of the three (3) preceding ways, then the ASIC designer may develop a functional block specifically for the ASIC. As is readily apparent, once a functional block has been developed as a last resort for a particular ASIC design, that functional block then becomes available for reuse in a subsequent ASIC design.

While the use of functional blocks in ASIC design shortens the time required to develop and test a particular ASIC, the economies which compel the use of ASICs by system builders ultimately causes a commercial disadvantage for companies which purchase ASICs for assembly into systems. Because the functionality which systems assembled using ASICs is, to a significant extent, established by the functionality inherent in the ASICs' designs, competing companies which assemble systems using ASICs' experience difficulty in functionally differentiating among their respective competing products. That is, if the functionality inherent in the ASIC design controls or limits the functions that a system builder's product may provide, then systems from various different competing companies will then all possess and offer essentially the same functionality. If systems from various different competing companies all offer essentially the same function, the system builders can then compete primarily only on price and/or delivery. Consequently, system builders are always seeking ways in which they can functionally differentiate their products from those of their competitors even though the competing products are assembled using essentially identical ASICs.

One way in which system builders seek to functionally differentiate their products from those of their competitors is through functions provided by software included in the system. While the functionality provided by computer programs can be readily changed or enhanced to differentiate among competing systems, software can never provide system builders with complete freedom in differentiating among competing products because the performance provided by software functionality is generally several order of magnitude less than the performance which can be achieved if the functionality is embedded into an ASIC.

This performance difference between hardware and software also exemplifies the fact that in designing any digital computer system there always exist trade-offs between implementing a function in hardware or software. That is a system designer is always free to choose to implement a particular function in hardware, software, or a combination of hardware and software. While implementing a particular function in hardware almost inevitably results in better performance, implementing that function in hardware may require using a more expensive ASIC in the system which will ultimately result either in a higher price for the system, or reduced profit for the system builder. Thus, at present selecting particular ASICs to be assembled into a digital computer system essentially determines how system functionality is to be partitioned between hardware and software. Once ASICs have been chosen for a system, any functionality which the ASICs lack can be provided only by the system's software. That is, there presently does not exist any way system builders can enhance or add hardware functionality to an existing system design other than by redesigning the system to use different ASICs.

SUMMARY OF THE INVENTION

The present invention offers system builders an ability to functionally distinguish between competing products.

An object of the present invention is to provide ASICs which permits system builders to functionally differentiate among products assembled using essentially identical ASICs.

Another object of the present invention is to provide ASICs which provides enhanced flexibility in partitioning a system's overall design between hardware and software.

Briefly, the present invention is an ASIC that includes at least one hardware, non-programmable functional block which is adapted for performing a function. The ASIC also includes a programmable logic block ("PLB") that is electrically programmable for performing at least one function that complements a function performed by the hardware, non-programmable functional block.

The presence of the PLB in the ASIC provides system builders with an opportunity to readily differentiate products within their respective product lines by adding particular functions to the ASIC, and to also functionally differentiate among various products offered by competing system builders. The PLB permits the system builder to implement in hardware, rather than in software, one or more functions that complement a system function that is performed using the hardware, non-programmable functional block included in the ASIC. As is readily apparent to those skilled in the art, implementing in hardware, rather than in software, one or more functions that complement a system function performed by the hardware non-programmable functional block produces a system that exhibits improved performance. These and other features, objects and advantages of the present invention will be understood or apparent to those of ordinary skill in the art from the following detailed description of the preferred embodiment as illustrated in the various drawing figures.

DETAILED DESCRIPTION OF THE PREFERRED EMBODIMENT

Figure 1:
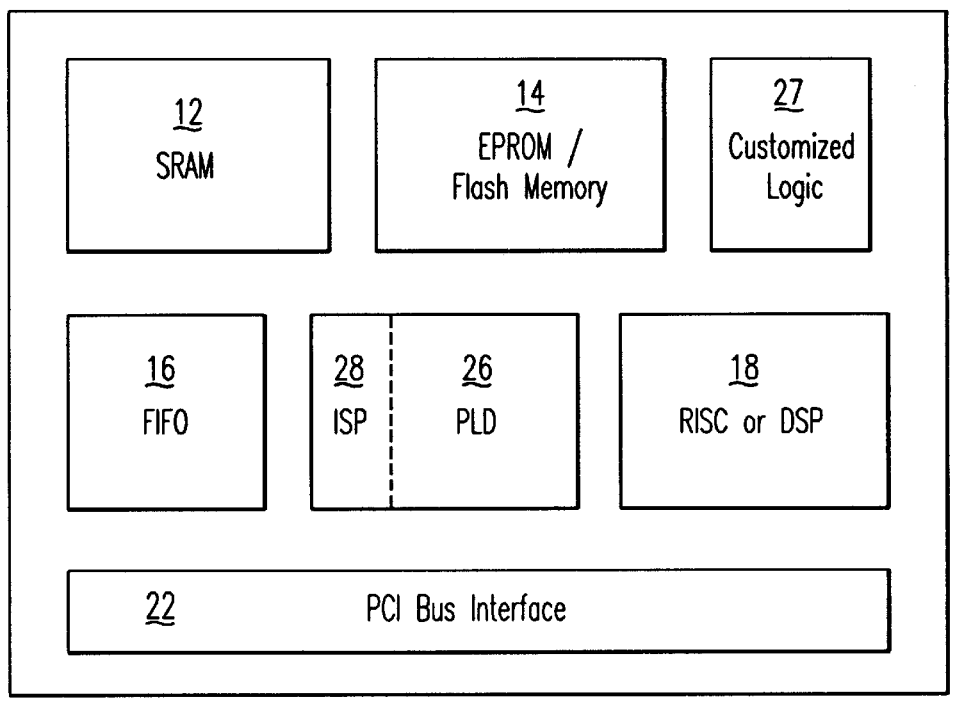
FIG. 1 is a functional block diagram depicting an ASIC in accordance with the present invention adapted for use as a PCI Bus Controller.

Referring now to FIG. 1, depicted there is a block diagram of a PCI Bus Controller ("PCIBC") ASIC in accordance with the present invention that is referred to by the general reference character 10. Conventional functional blocks included in the PCIBC 10 include a SRAM block 12, an EEPROM or Flash Memory block 14, a FIFO block 16, a RISC processor or DSP block 18, and a PCI bus interface block 22. In principle, the RISC processor or DSP block 18 can be any type of central processing unit ("CPU") including a DSP, a micro-controller, RISC or a complex instruction set computer ("CISC"). Including the PCI bus interface block 22 in the PCIBC 10 adapts it for connection to a PCI bus. However, the PCI bus interface block 22 could be replaced by an ISA bus interface block which thereby adapting the controller for connection to an ISA bus. Alternatively, the PCI bus interface block 22 could be replaced by a USB or EISA bus interface block which thereby adapting the controller for connection to a USB or EISA bus. Identification and selection of data specifying specific functional blocks suitable for inclusion in the PCIBC 10, and the subsequent integration of such data into an operable design for the PCIBC 10 can be performed by those of ordinary skill in the art of ASIC design.

In addition to the conventional functional blocks identified above that are included in the PCIBC 10, the PCIBC 10 in accordance with the present invention also includes a PLB 26. Upon incorporating a PCIBC 10 in accordance with the present invention into a system, presence of the PLB 26 in the PCIBC 10 provides system builders with an opportunity to readily differentiate products within their own product lines by adding particular functions to the PCIBC 10, and also functionally differentiate among various products offered by competitors. That is, the presence of the PLB 26 in the PCIBC 10 permits the system builder to implement in hardware, rather than in software, one or more functions that complement a system function that is performed using at least one of the functional blocks included in the PCIBC 10, i.e. SRAM block 12, EEPROM or Flash Memory block 14, FIFO block 16, RISC processor or DSP block 18 and/or PCI bus interface block 22.

For example, in the instance of the PCIBC 10, the system builder could program the PLB 26 to decode operations for a specific peripheral device rather than performing such peripheral device decoding in operating system software. As described above, a system which performs peripheral device decoding in hardware performs that function much more quickly than a system which performs peripheral device decoding in software. As is readily apparent, the presence of the PLB 26 in the PCIBC 10 thus permits system builders to adapt systems functionally for specific operating environments depending upon the particular function which the system builder chooses to program into the PLB 26 rather than having that function performed in software.

More specifically, customized logic 27, included in the PCIBC 10, is shared among certain application such as a media access controller ("MAC"), and address resolution logic ("ARL"), or DMA controller to manage the data transmission, etc. Thus, including the PCIBC 10 in a computer system permits the RISC processor or DSP block 18 to receive signals from a modem, a telephone line, local area network ("LAN"), or any audio or digital signal input. The RISC processor or DSP block 18 can then decode or process the received signals to convert them into a specified format or sequence. After decoding or processing, the RISC processor or DSP block 18 stores the result either into the FIFO block 16 which operates as a pipeline storage, or into a queue located in the SRAM block 12. In addition to providing storage for a queue, the SRAM block 12 may also provide scratch pad storage for the RISC processor or DSP block 18. A CPU (not illustrated in any of the FIGS.), that is included in the computer system, communicates with the RISC processor or DSP block 18 through the PCI bus interface block 22. The EEPROM or Flash Memory block 14 provides non-volatile memory which can store configuration data. In such a system designers could advantageously use the PLB 26 to provide unique TCP/IP processing. An in-system programming ("ISP") interface 28, included in the PLB 26, provides a port through which the PLB 26 may be programmed or configured to implement such TCP/IP processing.

Figure 2:
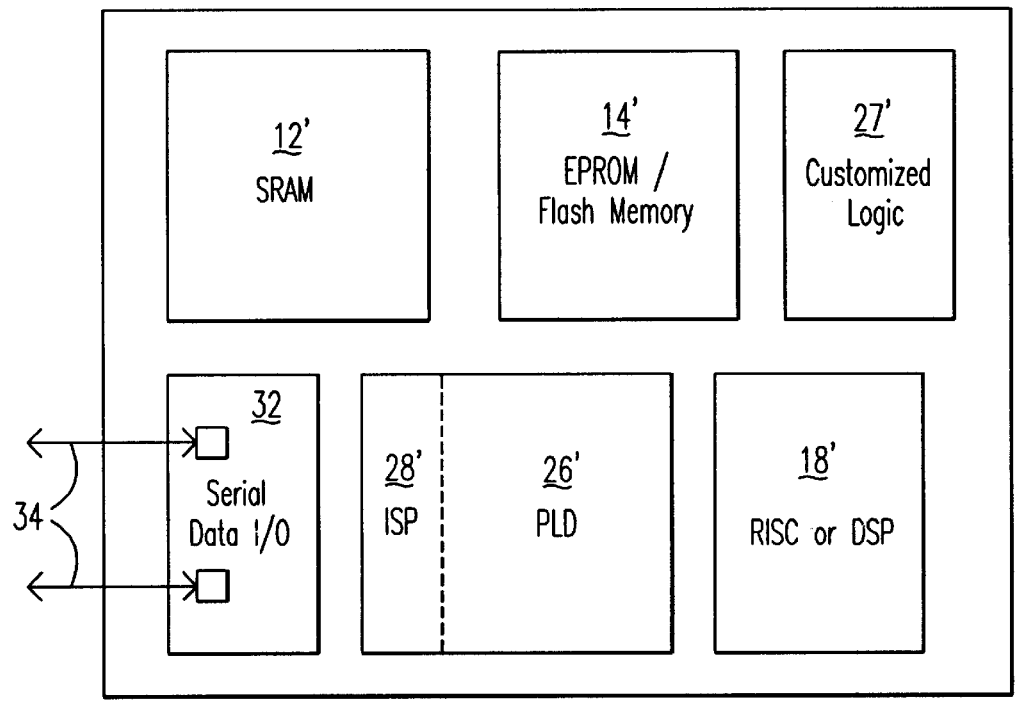
FIG. 2 is a functional block diagram depicting an ASIC in accordance with the present invention adapted for use as a Smart Card Controller.

FIG. 2 depicts a Smart Card Controller ("SCC") ASIC in accordance with the present invention that is referred to by the general reference character 30. Those elements of the SCC 30 depicted in FIG. 2 that are common to the PCIBC 10 depicted in FIG. 1 carry the same reference numeral distinguished by a prime ("'") designation. The SCC 30 includes all of the same functional blocks as the PCIBC 10 except that a conventional functional SIO block 32 replaces the FIFO block 16. In the instance of the SCC 30, functionality provided by the conventional functional blocks would be complemented by adding a hardware encryption/decryption function programmed into the PLB 26'.

The SIO block 32 provides a serial data link physical interface, indicated by arrowed lines 34, useful for protocols such as Token Ring, SDLC/HDLC etc. Included in the SCC 30, the RISC processor or DSP block 18' handles the protocols, instructions or data streams received through the SIO block 32. The customized logic 27' handles particular tasks, which are common for different applications. The SRAM block 12' can be used for temporary storage or as a scratch pad. The EEPROM or Flash Memory block 14' stores configuration data. The PLB 26' permits system builders to differentiate their respective implementations. Thus the PLB 26' may be used for encryption or decryption algorithms, managing various bus interfaces or devices, or displaying system status. As described for the PCIBC 10, the ISP interface 28' permits programming the PLB 26' to perform a desired function that facilitates serial data communication.

Figure 3:
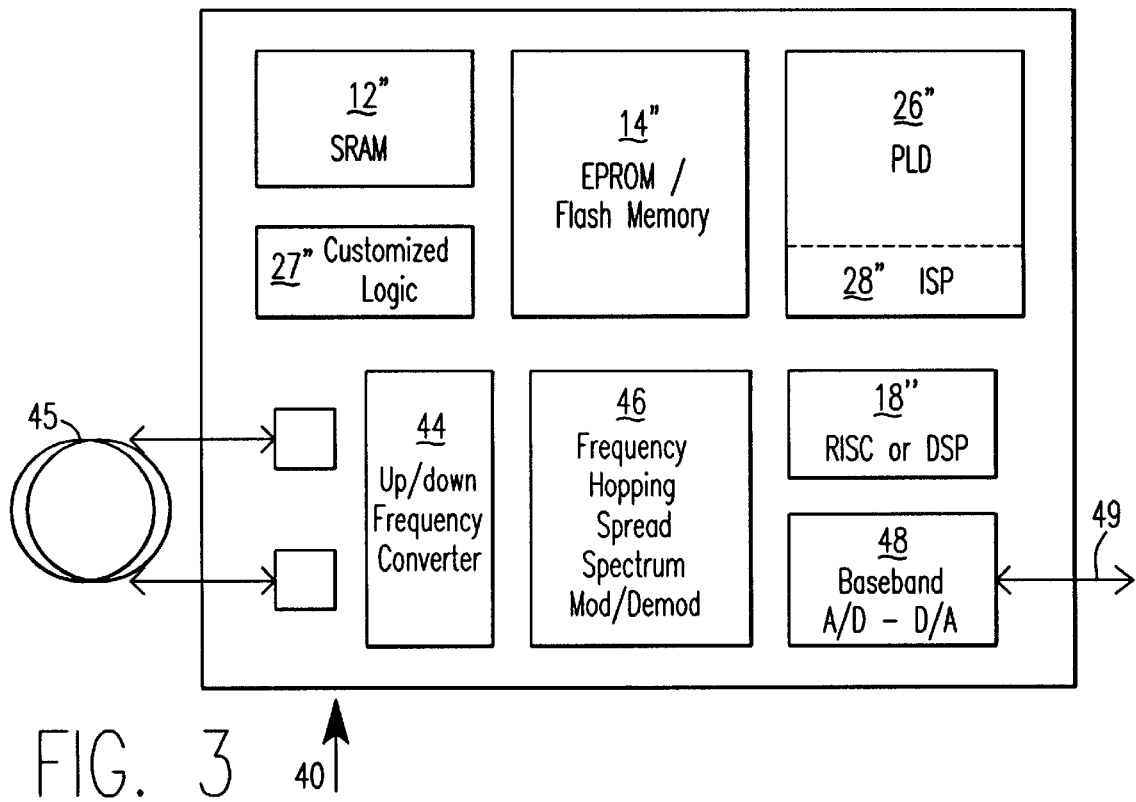
FIG. 3 is a functional block diagram depicting an ASIC in accordance with the present invention adapted for use as a RF Datacom Integrated Circuit.

FIG. 3 depicts a RF Datacom Integrated Circuit ("RFDIC") ASIC in accordance with the present invention that is referred to by the general reference character 40. Those elements of the RFDIC 40 depicted in FIG. 3 that are common to the PCIBC 10 depicted in FIG. 1, or that are common to the SCC 30 depicted in FIG. 2 carry the same reference numeral distinguished by a double prime ("''") designation. In addition to the conventional functional blocks of the SRAM block 12", EEPROM or Flash Memory block 14" and RISC processor or DSP block 18", the RFDIC 40 includes a conventional Up/Down Frequency Converter block 44, a conventional Frequency-Hopping Spread-Spectrum Modulator/Demodulator block 46, and a conventional Baseband ADC—DAC block 48. The functionality provided by the conventional functional blocks of the RFDIC 40 would be complemented by programming TCP/IP protocol functionality into the hardware provided by the PLB 26" rather than providing such functionality in software.

The RFDIC 40" can be used wireless communications, such as mobile phones, GPS, personal communication systems ("PCS"), etc. The Up/Down Frequency Converter block 44" provides a transceiver for wireless transmission and reception via an antenna 45. The Frequency-Hopping Spread-Spectrum Modulator/Demodulator block 46" may be used to provide automatic frequency locking and automatic gain control. The Frequency-Hopping Spread-Spectrum Modulator/Demodulator block 46" may also convert between a frequency transmitted from or received by the Up/Down Frequency Converter block 44" and an intermediate frequency ("IF"), and modulate or demodulate the signal transmitted from or received by the Up/Down Frequency Converter block 44". The RISC processor or DSP block 18" may perform encoding, decoding, signal recognition processing or synthesizing of the IF as required for different protocols. The customized logic 27' is common to various applications. The embedded SRAM block 12' provides temporary storage or scratch pad. the EEPROM or Flash Memory block 14' can store configuration data. As indicated by an arrowed line 49, the Baseband ADC—DAC block 48' permits communication with Human Interface Devices ("HID") that are external to the RFDIC 40 such as status displays, microphones, or video displays. For the RFDIC 40', the PLB 26' can facilitate customizing security codes, types of communication services, or processing different protocols. Using the ISP interface 28', the PLB 26' can be programmed to provide such customization, even remotely.

While there exist various alternative IC technologies which an ASIC designer could select for the PLB 26, a PLB 26 in accordance with the preferred embodiment of the present invention employs Programmable Logic Device ("PLD"). PLD technology is preferred for the present invention because it is simpler to use than FPGA technology. Furthermore, any function programmed into the PLB 26 implemented with PLD technology inherently possess predictable circuit timing characteristics.

Although the present invention has been described in terms of the presently preferred embodiment, it is to be understood that such disclosure is purely illustrative and is not to be interpreted as limiting. For example, rather than using a re-programmable general purpose FPGA technology for interconnecting the various fixed functional logic units of a ASIC in accordance with the present invention into a functional ASIC, for production devices it may prove advantageous to employ a write once digital programmable logic technology, such as a GAL technology, rather than re-programmable FPGA technology. In production, after an ASIC has been fully developed, use of a re-programmable technology may be undesirable, and could even be disadvantageous. Accordingly, an ASIC in accordance with the present invention may employ either a re-programmable FPGA technology, or a write once programmable digital logic technology. Consequently, without departing from the spirit and scope of the invention, various alterations, modifications, and/or alternative applications of the invention will, no doubt, be suggested to those skilled in the art after having read the preceding disclosure. Accordingly, it is intended that the following claims be interpreted as encompassing all alterations, modifications, or alternative applications as fall within the true spirit and scope of the invention.

What is claimed is:

1. In an application specific integrated circuit ("ASIC") that includes at least one hardware, non-programmable functional block adapted for performing a function, an improvement comprising:
    a programmable logic block ("PLB") included in the ASIC, said PLB being electrically programmable for performing, during normal operation of the ASIC, at least one function that complements the function performed using the hardware, non-programmable functional block.

2. The ASIC of claim 1 wherein the hardware, non-programmable functional block is a bus interface block.

3. The ASIC of claim 2 wherein the bus interface block is an Industry Standard Architecture ("ISA") bus interface block.

4. The ASIC of claim 2 wherein the bus interface block is an Peripheral Component Interconnect ("PCI") bus interface block.

5. The ASIC of claim 2 wherein the bus interface block is a Universial Serial Bus ("USB") block¯.

6. The ASIC of claim 1 the ASIC is a PCI Bus Controller ("PCIBC").

7. The ASIC of claim 6 wherein the hardware, non-programmable functional block of the PCIBC is a First-In/First-Out ("FIFO") block, and a second hardware, non-programmable functional block included in the PCIBC is a processor block.

8. The ASIC of claim 7 wherein the processor block is a Reduced Instruction Set Computer ("RISC") microprocessor.

9. The ASIC of claim 1 wherein the ASIC is a Smart Card Controller ("SCC").

10. The ASIC of claim 9 wherein the hardware, non-programmable functional block of the SCC is a Serial Data I/O ("SIO") block, and the SCC includes a second hardware, non-programmable functional block that is a processor block.

11. The ASIC of claim 10 wherein the processor block is a RISC microprocessor.

12. The ASIC of claim 1 wherein the ASIC is a RF Datacom Integrated Circuit ("RFDIC").

13. The ASIC of claim 12 wherein the hardware, non-programmable functional block of the RFDIC is an Up/Down Frequency Converter block, and the RFDIC includes a second hardware, non-programmable functional block that is a processor block.

14. The ASIC of claim 13 wherein the processor block is a Digital Signal Processor ("DSP").

15. The ASIC of claim 12 wherein the hardware, non-programmable functional block of the RFDIC is a Frequency-Hopping Spread-Spectrum Modulator/Demodulator block, and the RFDIC includes a second hardware, non-programmable functional block that is a processor block.

16. The ASIC of claim 15 wherein the processor block is a DSP.

17. The ASIC of claim 12 wherein the hardware, non-programmable functional block of the RFDIC is a Base-band Analog-to-Digital Converter ("ADC") and Digital-to-Analog ("DAC") block, and the RFDIC includes a second hardware, non-programmable functional block that is a processor block.

18. The ASIC of claim 17 wherein the processor block is a DSP.

19. The ASIC of claim 17 wherein the processor block is a RISC microprocessor.

20. An ASIC comprising:
   a hardware, non-programmable functional block which is adapted for performing a functions; and
   a PLB that is electrically programmable for performing, during normal operation of the ASIC, at least one function that complements a function performed by said hardware, non-programmable functional block.

21. In a PCIBC ASIC that includes at least:
   a first hardware, non-programmable FIFO functional block; and
   a second hardware, non-programmable processor functional block;
an improvement comprising:
   a PLB included in the ASIC, said PLB being electrically programmable for performing, during normal operation of the ASIC, at least one function that complements the function performed using the hardware, non-programmable FIFO functional block.

22. The ASIC of claim 21 wherein the processor block is a RISC microprocessor.

23. In a SCC ASIC that includes at least:
   a first hardware, non-programmable SIO functional block; and
   a second hardware, non-programmable processor functional block;
an improvement comprising:
   a PLB included in the ASIC, said PLB being electrically programmable for performing, during normal operation of the ASIC, at least one function that complements the function performed using the hardware, non-programmable SIO functional block.

24. The ASIC of claim 23 wherein the processor block is a RISC microprocessor.

25. In a RFDIC ASIC that includes at least:
   a first hardware, non-programmable Up/Down Frequency Converter functional block; and
   a second hardware, non-programmable processor functional block;
an improvement comprising:
   a PLB included in the ASIC, said PLB being electrically programmable for performing, during normal operation of the ASIC, at least one function that complements the function performed using the hardware, non-programmable Up/Down Frequency Converter functional block.

26. The ASIC of claim 25 wherein the processor block is a DSP.

27. In a RFDIC ASIC that includes at least:
   a first hardware, non-programmable Frequency-Hopping Spread-Spectrum Modulator/Demodulator functional block; and
   a second hardware, non-programmable processor functional block;
an improvement comprising:
   a PLB included in the ASIC, said PLB being electrically programmable for performing, during normal operation of the ASIC, at least one function that complements the function performed using the hardware, non-programmable Frequency-Hopping Spread-Spectrum Modulator/Demodulator functional block.

28. The ASIC of claim 27 wherein the processor block is a DSP.

29. In a RFDIC ASIC that includes at least:
   a first hardware, non-programmable Base-band ADC and DAC functional block; and
   a second hardware, non-programmable processor functional block;
an improvement comprising:
   a PLB included in the ASIC, said PLB being electrically programmable for performing, during normal operation of the ASIC, at least one function that complements the function performed using the hardware, non-programmable Base-band ADC and DAC functional block.

30. The ASIC of claim 29 wherein the processor block is a DSP.

31. The ASIC of claim 29 wherein the processor block is a RISC microprocessor.

* * * * *

UNITED STATES PATENT AND TRADEMARK OFFICE
CERTIFICATE OF CORRECTION

PATENT NO.        : 6,260,087 C1
APPLICATION NO.   : 90/011534
DATED             : July 3, 2012
INVENTOR(S)       : Web Chang It is certified that error appears in the above-identified patent and that said Letters Patent is hereby corrected as shown below:

Column 1

Lines 20-66, claims 32-45, strikethrough the entire claim language and replace with claim language of claims 32-45 from the *Appendix*.

Column 2

Lines 1-64, claims 46-60, strikethrough the entire claim language and replace with claim language of claims 46-60 from the *Appendix*.

Signed and Sealed this
Eighteenth Day of December, 2012

David J. Kappos
*Director of the United States Patent and Trademark Office*

UNITED STATES PATENT AND TRADEMARK OFFICE
CERTIFICATE OF CORRECTION

PATENT NO.        : 6,260,087 C1                                Page 1 of 10
APPLICATION NO.   : 90/011534
DATED             : July 3, 2012
INVENTOR(S)       : Web Chang It is certified that error appears in the above-identified patent and that said Letters Patent is hereby corrected as shown below:

Column 1, line 20-Column 2, line 66, delete claims 32-60 and substitute with replacement claims 32-60 as shown on attached pages.

This certificate supersedes the Certificate of Correction issued December 18, 2012.

Signed and Sealed this
Twenty-first Day of May, 2013

Teresa Stanek Rea
*Acting Director of the United States Patent and Trademark Office*

32. In an application specific integrated circuit ("ASIC") that includes at least one hardware, non-programmable functional block adapted for performing a function, an improvement comprising:

a programmable logic block ("PLB") included in the ASIC, said PLB being electrically programmable for performing, during normal operation of the ASIC, at least one function that complements the function performed using the hardware, non-programmable functional block, wherein the hardware, non-programmable functional block is customized logic common to a plurality of applications.

33. The ASIC of claim 32, wherein at least one function that complements the function performed using the hardware, non-programmable functional block is encryption/decryption.

34. The ASIC of claim 32, wherein at least one function that complements the function performed using the hardware, non-programmable functional block is managing bus interfaces.

35. The ASIC of claim 32, wherein at least one function that complements the function performed using the hardware, non-programmable functional block is displaying system status.

36. In an application specific integrated circuit ("ASIC") that includes at least one hardware, non-programmable functional block adapted for performing a function, an improvement comprising:

a programmable logic block ("PLB") included in the ASIC, said PLB being electrically programmable for performing, during normal operation of the ASIC, at least one function that complements the function performed using the hardware, non-programmable functional block, wherein the hardware, non-programmable functional block is a Serial I/O block, wherein at least one function that complements the function performed using the hardware, non-programmable functional block is displaying system status.

37. In an application specific integrated circuit ("ASIC") that includes at least one hardware, non-programmable functional block adapted for performing a function, an improvement comprising:

a programmable logic block ("PLB") included in the ASIC, said PLB being electrically programmable for performing, during normal operation of the ASIC, at least one function that complements the function performed using the hardware, non-programmable functional block, wherein the hardware, non-programmable functional block is a processor block, wherein at least one function that complements the function performed using the hardware, non-programmable functional block is displaying system status.

*38. In an application specific integrated circuit ("ASIC") that includes at least one hardware, non-programmable functional block adapted for performing a function, an improvement comprising:*

*a programmable logic block ("PLB") included in the ASIC, said PLB being electrically programmable for performing, during normal operation of the ASIC, at least one function that complements the function performed using the hardware, non-programmable functional block, wherein the hardware, non-programmable functional block is a transceiver.*

*39. The ASIC of claim 38, wherein at least one function that complements the function performed using the hardware, non-programmable functional block is encryption/decryption.*

*40. In an application specific integrated circuit ("ASIC") that includes at least one hardware, non-programmable functional block adapted for performing a function, an improvement comprising:*

*a programmable logic block ("PLB") included in the ASIC, said PLB being electrically programmable for performing, during normal operation of the ASIC, at least one function that complements the function performed using the hardware, non-programmable functional block, wherein the hardware, non-programmable functional block is a FLASH memory block.*

*41. In an application specific integrated circuit ("ASIC") that includes at least one hardware, non-programmable functional block adapted for performing a function, an improvement comprising:*

*a programmable logic block ("PLB") included in the ASIC, said PLB being electrically programmable for performing, during normal operation of the ASIC, at least one function that complements the function performed using the hardware, non-programmable functional block, wherein at least one function that complements the function performed using the hardware, non-programmable functional block is displaying system status.*

*42. An ASIC comprising:*

*a hardware, non-programmable functional block which is adapted for performing a function; and*

*a PLB that is electrically programmable for performing, during normal operation of the ASIC, at least one function that complements a function performed by said hardware, non-programmable functional block, wherein the hardware, non-programmable functional block is customized logic common to a plurality of applications.*

*43. The ASIC of claim 42, wherein at least one function that complements the function performed using the hardware, non-programmable functional block is encryption/decryption.*

*44. The ASIC of claim 42, wherein at least one function that complements the function performed using the hardware, non-programmable functional block is managing bus interfaces.*

*45. The ASIC of claim 42, wherein at least one function that complements the function performed using the hardware, non-programmable functional block is displaying system status.*

*46. An ASIC comprising:*

*a hardware, non-programmable functional block which is adapted for performing a function; and*

*a PLB that is electrically programmable for performing, during normal operation of the ASIC, at least one function that complements a function performed by said hardware, non-programmable functional block, wherein the hardware, non-programmable functional block is a Serial I/O block, wherein at least one function that complements the function performed using the hardware, non-programmable functional block is displaying system status.*

*47. An ASIC comprising:*

*a hardware, non-programmable functional block which is adapted for performing a function; and*

*a PLB that is electrically programmable for performing, during normal operation of the ASIC, at least one function that complements a function performed by said hardware, non-programmable functional block, wherein the hardware, non-programmable functional block is a processor block, wherein at least one function that complements the function performed using the hardware, non-programmable functional block is displaying system status.*

*48. An ASIC comprising:*

*a hardware, non-programmable functional block which is adapted for performing a function; and*

*a PLB that is electrically programmable for performing, during normal operation of the ASIC, at least one function that complements a function performed by said hardware, non-*

*programmable functional block, wherein the hardware, non-programmable functional block is a transceiver.*

*49. The ASIC of claim 48, wherein at least one function that complements the function performed using the hardware, non-programmable functional block is encryption/decryption.*

*50. An ASIC comprising:*

*a hardware, non-programmable functional block which is adapted for performing a function; and*

*a PLB that is electrically programmable for performing, during normal operation of the ASIC, at least one function that complements a function performed by said hardware, non-programmable functional block, wherein at least one function that complements the function performed using the hardware, non-programmable functional block is displaying system status.*

*51. An application specific integrated circuit ("ASIC") comprising:*

*a hardware, non-programmable functional block adapted for performing a function; and*

*an electrically programmable programmable logic block ("PLB") included in the ASIC, said PLB performing, during normal operation of the ASIC, at least one function that complements the function performed using the hardware, non-programmable functional block, wherein the hardware, non-programmable functional block is customized logic common to a plurality of applications.*

*52. The ASIC of claim 51, wherein at least one function that complements the function performed using the hardware, non-programmable functional block is encryption/decryption.*

53. The ASIC of claim 51, wherein at least one function that complements the function performed using the hardware, non-programmable functional block is managing bus interfaces.

54. The ASIC of claim 51, wherein at least one function that complements the function performed using the hardware, non-programmable functional block is displaying system status.

55. An application specific integrated circuit ("ASIC") comprising:

a hardware, non-programmable functional block adapted for performing a function; and an electrically programmable programmable logic block ("PLB") included in the ASIC, said PLB performing, during normal operation of the ASIC, at least one function that complements the function performed using the hardware, non-programmable functional block, wherein the hardware, non-programmable functional block is a Serial I/O block, wherein at least one function that complements the function performed using the hardware, non-programmable functional block is displaying system status.

56. An application specific integrated circuit ("ASIC") comprising:

a hardware, non-programmable functional block adapted for performing a function; and an electrically programmable programmable logic block ("PLB") included in the ASIC, said PLB performing, during normal operation of the ASIC, at least one function that complements the function performed using the hardware, non-programmable functional block, wherein the hardware, non-programmable functional block is a processor block, wherein at least one function that complements the function performed using the hardware, non-programmable functional block is displaying system status.

*57. An application specific integrated circuit ("ASIC") comprising:*

*a hardware, non-programmable functional block adapted for performing a function; and*

*an electrically programmable programmable logic block ("PLB") included in the ASIC, said PLB performing, during normal operation of the ASIC, at least one function that complements the function performed using the hardware, non-programmable functional block wherein the hardware, non-programmable functional block is a transceiver.*

*58. The ASIC of claim 57, wherein at least one function that complements the function performed using the hardware, non-programmable functional block is encryption/decryption.*

*59. An application specific integrated circuit ("ASIC") comprising:*

*a hardware, non-programmable functional block adapted for performing a function; and*

*an electrically programmable programmable logic block ("PLB") included in the ASIC, said PLB performing, during normal operation of the ASIC, at least one function that complements the function performed using the hardware, non-programmable functional block, wherein the hardware, non-programmable functional block is a FLASH memory block.*

*60. An application specific integrated circuit ("ASIC") comprising:*

*a hardware, non-programmable functional block adapted for performing a function; and*

*an electrically programmable programmable logic block ("PLB") included in the ASIC, said PLB performing, during normal operation of the ASIC, at least one function that complements the function performed using the hardware, non-programmable functional block, wherein at least one function that complements the function performed using the hardware, non-programmable functional block is displaying system status.*

US006260087C1

(12) EX PARTE REEXAMINATION CERTIFICATE (9109th)
United States Patent
Chang

(10) Number: US 6,260,087 C1
(45) Certificate Issued: Jul. 3, 2012

(54) EMBEDDED CONFIGURABLE LOGIC ASIC

(75) Inventor: Web Chang, Fremont, CA (US)

(73) Assignee: Intellectual Ventures II LLC, Wilmington, DE (US)

Reexamination Request:
No. 90/011,534, Mar. 4, 2011

Reexamination Certificate for:
Patent No.: 6,260,087
Issued: Jul. 10, 2001
Appl. No.: 09/261,244
Filed: Mar. 3, 1999

(51) Int. Cl.
*H03K 19/173* (2006.01)

(52) U.S. Cl. ........................ 710/100; 326/39; 710/104; 712/32; 712/36

(58) Field of Classification Search .................... 710/100
See application file for complete search history.

(56) References Cited

To view the complete listing of prior art documents cited during the proceeding for Reexamination Control Number 90/011,534, please refer to the USPTO's public Patent Application Information Retrieval (PAIR) system under the Display References tab.

*Primary Examiner* — Woo H. Choi

(57) ABSTRACT

An Application Specific Integrated Circuit ("ASIC") (10, 30 and 40), which includes at least one hardware, non-programmable functional block (12, 14, 16, 18, 22, 32, 44, 46 and 48), also includes a programmable logic block ("PLB") (26). The PLB (26) is electrically programmable for performing at least one function that complements a function performed using the hardware, non-programmable functional block (12, 14, 16, 18, 22, 32, 44, 46 and 48). The presence of the PLB (26) in the ASIC providing system builders with an opportunity to readily differentiate products within their respective product lines by adding particular functions to the ASIC, and to also functionally differentiate among various products offered by competing system builders.

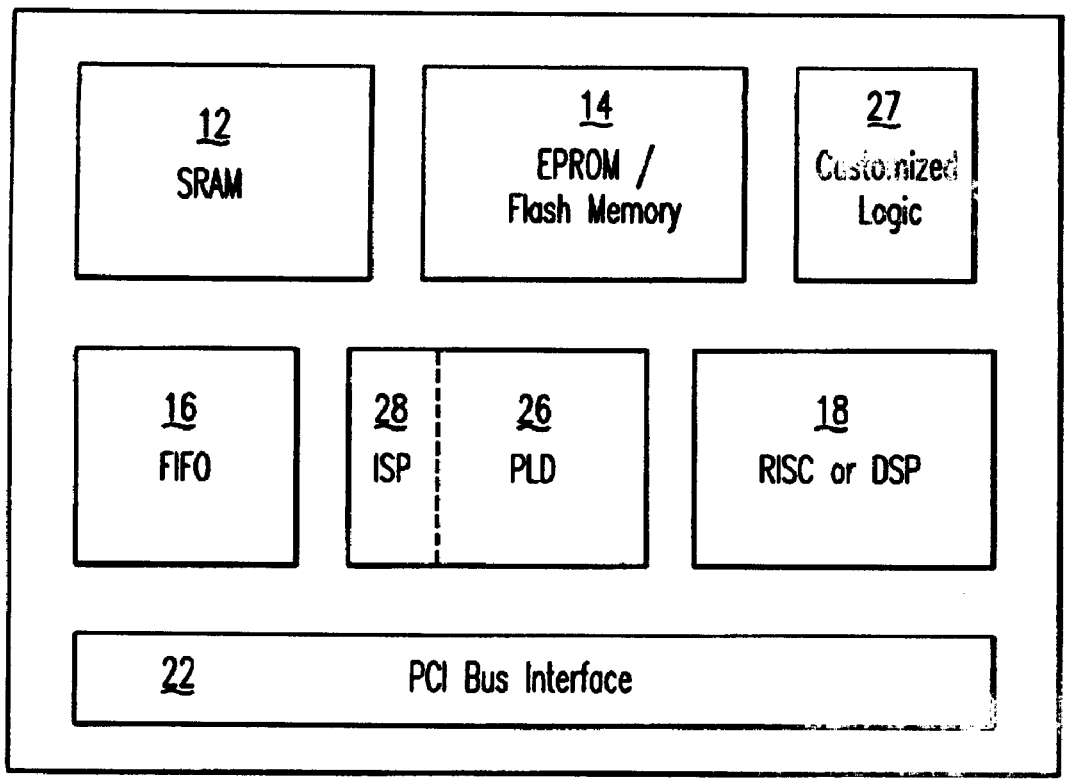

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-31 are cancelled.

New claims 32-60 are added and determined to be patentable.

32. *The ASIC of claim 1, wherein the PLB comprises an in-system programming ("ISP") interface.*

33. *The ASIC of claim 32, wherein the PLB comprises a programmable logic device (PLD).*

34. *The ASIC of claim 33, wherein the PLD is externally programmable via the ISP interface.*

35. *The ASIC of claim 32, wherein the PLB is externally reprogrammable via the ISP interface.*

36. *The ASIC of claim 1, wherein the PLB comprises a programmable logic device (PLD).*

37. *The ASIC of claim 1, wherein the PLB is externally reprogrammable.*

38. *The ASIC of claim 32, wherein the PLB comprises a field programmable gate array (FPGA).*

39. *The ASIC of claim 38, wherein the FPGA is externally programmable via the ISP interface.*

40. *The ASIC of claim 1, wherein the PLB comprises a field programmable gate array (FPGA).*

41. *The ASIC of claim 1, wherein the hardware, non-programmable functional block is customized logic common to a plurality of applications.*

42. *The ASIC of claim 41, wherein at least one function that complements the function performed using the hardware, non-programmable functional block is a TCP/IP protocol function.*

43. *The ASIC of claim 41, wherein at least one function that complements the function performed using the hardware, non-programmable functional block is encryption/decryption.*

44. *The ASIC of claim 41, wherein at least one function that complements the function performed using the hardware, non-programmable functional block is managing bus interfaces.*

45. *The ASIC of claim 41, wherein at least one function that complements the function performed using the hardware, non-programmable functional block is displaying system status.*

46. *The ASIC of claim 1 wherein the hardware, non-programmable functional block is a Serial I/O block.*

47. *The ASIC of claim 46, wherein at least one function that complements the function performed using the hardware, non-programmable functional block is a TCP/IP protocol function.*

48. *The ASIC of claim 46, wherein at least one function that complements the function performed using the hardware, non-programmable functional block is encryption/decryption.*

49. *The ASIC of claim 46, wherein at least one function that complements the function performed using the hardware, non-programmable functional block is managing bus interfaces.*

50. *The ASIC of claim 46, wherein at least one function that complements the function performed using the hardware, non-programmable functional block is displaying system status.*

51. *The ASIC of claim 1 wherein the hardware, non-programmable functional block is a First-in/First out (FIFO) block.*

52. *The ASIC of claim 51, wherein at least one function that complements the function performed using the hardware, non-programmable functional block is a TCP/IP protocol function.*

53. *The ASIC of claim 1 wherein the hardware, non-programmable functional block is a processor block.*

54. *The ASIC of claim 53, wherein the processor is a Digital Signal Processor (DSP) block.*

55. *The ASIC of claim 53, wherein the processor block is a Reduced Instruction Set Computer (RISC) Processor block.*

56. *The ASIC of claim 53, wherein at least one function that complements the function performed using the hardware, non-programmable functional block is a TCP/IP protocol function.*

57. *The ASIC of claim 53, wherein at least one function that complements the function performed using the hardware, non-programmable functional block is encryption/decryption.*

58. *The ASIC of claim 53, wherein at least one function that complements the function performed using the hardware, non-programmable functional block is managing bus interfaces.*

59. *The ASIC of claim 53, wherein at least one function that complements the function performed using the hardware, non-programmable functional block is displaying system status.*

60. *The ASIC of claim 1, wherein the hardware, non-programmable functional block is an encoder/decoder.*

\* \* \* \* \*

(12) EX PARTE REEXAMINATION CERTIFICATE (10315th)

United States Patent
Chang

(10) Number: US 6,260,087 C2
(45) Certificate Issued: Oct. 8, 2014

(54) EMBEDDED CONFIGURABLE LOGIC ASIC

(75) Inventor: Web Chang, Fremont, CA (US)

(73) Assignee: Intellectual Ventures II LLC, Wilmington, DE (US)

Reexamination Request:
No. 90/012,596, Sep. 14, 2012

Reexamination Certificate for:
Patent No.: 6,260,087
Issued: Jul. 10, 2001
Appl. No.: 09/261,244
Filed: Mar. 3, 1999

Reexamination Certificate C1 6,260,087 issued Jul. 3, 2012

Certificate of Correction issued Dec. 18, 2012

Certificate of Correction issued May 21, 2013

(51) Int. Cl.
*H03K 19/173* (2006.01)
(52) U.S. Cl.
USPC .............. 710/100; 710/104; 326/39; 712/32; 712/36

(58) Field of Classification Search
None
See application file for complete search history.

(56) References Cited

To view the complete listing of prior art documents cited during the proceeding for Reexamination Control Number 90/012,596, please refer to the USPTO's public Patent Application Information Retrieval (PAIR) system under the Display References tab.

*Primary Examiner* — Hetul Patel

(57) ABSTRACT

An Application Specific Integrated Circuit ("ASIC") (10, 30 and 40), which includes at least one hardware, non-programmable functional block (12, 14, 16, 18, 22, 32, 44, 46 and 48), also includes a programmable logic block ("PLB") (26). The PLB (26) is electrically programmable for performing at least one function that complements a function performed using the hardware, non-programmable functional block (12, 14, 16, 18, 22, 32, 44, 46 and 48). The presence of the PLB (26) in the ASIC providing system builders with an opportunity to readily differentiate products within their respective product lines by adding particular functions to the ASIC, and to also functionally differentiate among various products offered by competing system builders.

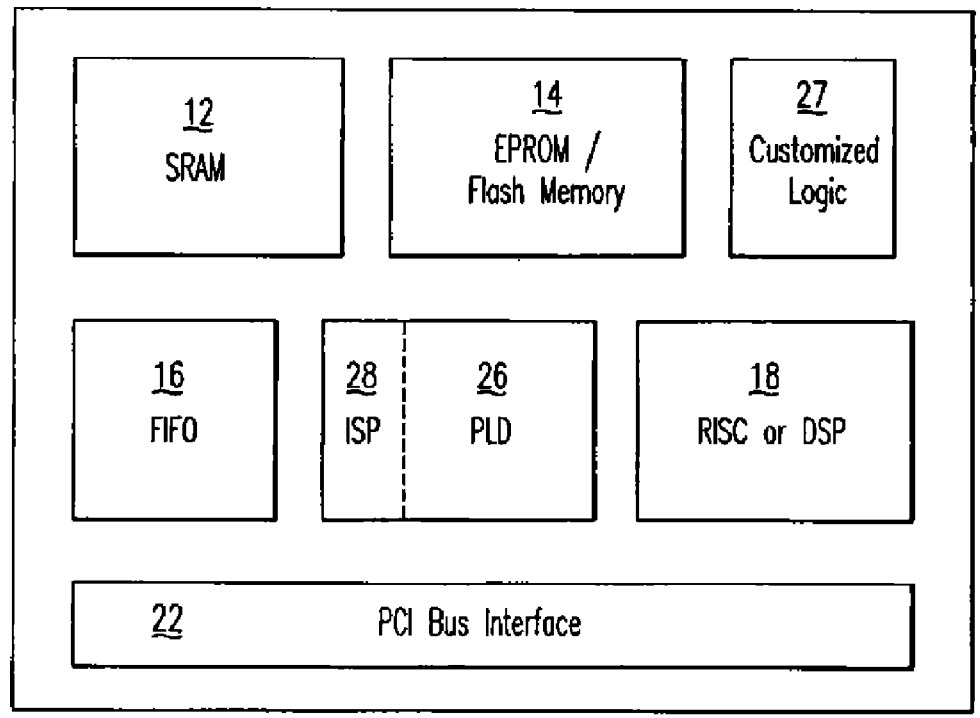

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-31 were previously cancelled.
Claims 32-60 are cancelled.

\* \* \* \* \*